(12) United States Patent
Barthel et al.

(10) Patent No.: US 7,577,267 B2
(45) Date of Patent: Aug. 18, 2009

(54) HEARING AID AND HEARING AID SYSTEM

(75) Inventors: Roland Barthel, Erlangen (DE); Bernd Beimel, Erlangen (DE); Joachim Eggers, Tübingen (DE); Matthias Fröhlich, Dechsendorf (DE)

(73) Assignee: Siemens Audiologische Technik gmbH, Erlangen (DE)

( * ) Notice: Subject to any disclaimer, the term of this patent is extended or adjusted under 35 U.S.C. 154(b) by 832 days.

(21) Appl. No.: 11/132,918

(22) Filed: May 19, 2005

(65) Prior Publication Data

US 2005/0259838 A1 Nov. 24, 2005

(30) Foreign Application Priority Data

May 21, 2004 (DE) .................. 10 2004 025 123

(51) Int. Cl.
*H04R 25/00* (2006.01)
(52) U.S. Cl. ..................... 381/315; 381/312
(58) Field of Classification Search ............. 381/315; 320/132
See application file for complete search history.

(56) References Cited

U.S. PATENT DOCUMENTS

| | | | | |
|---|---|---|---|---|
| 3,784,745 A | * | 1/1974 | Stearns | 73/585 |
| 4,628,907 A | * | 12/1986 | Epley | 600/25 |
| 4,777,474 A | * | 10/1988 | Clayton | 340/539.11 |
| 6,195,435 B1 | * | 2/2001 | Kitamura | 381/18 |
| 6,463,305 B1 | * | 10/2002 | Crane | 455/566 |
| 6,549,633 B1 | * | 4/2003 | Westermann | 381/312 |
| 2002/0159613 A1 | * | 10/2002 | Killion | 381/323 |

FOREIGN PATENT DOCUMENTS

| | | |
|---|---|---|
| DE | 198 25 750 A1 | 1/2000 |
| EP | 1 247 423 B1 | 10/2002 |

* cited by examiner

*Primary Examiner*—Brian Ensey
*Assistant Examiner*—Matthew Eason

(57) ABSTRACT

For a hearing aid, the information for the hearing aid wearer relating to the state of charge of the power source (4, 4') or the remaining life of the hearing aid with the relevant power source (4, 4') is to be improved. To this end means are provided for operating the hearing aid by which the state of charge or remaining life can be interrogated at any time, with the information about the state of charge or remaining life being provided to the hearing aid wearer by emitting an acoustic signal indicating the state of charge or remaining life. The hearing aid wearer can thus be informed conveniently and discretely at any time about the state of charge or the remaining life.

11 Claims, 2 Drawing Sheets

HEARING AID AND HEARING AID SYSTEM

CROSS REFERENCE TO RELATED APPLICATIONS

This application claims priority to the German application No 10 2004 025 123.1, filed May 21, 2004 which is incorporated by reference herein in its entirety.

FIELD OF INVENTION

The invention relates to a hearing aid and a hearing aid system.

BACKGROUND OF INVENTION

Hearing aids or hearing aid systems are usually equipped with a power source which is independent of the ac mains, that is with a battery or a rechargeable cell. A hearing aid is known from U.S. 2002/0159613 A1 with a power source in which an acoustic signal is emitted when the voltage falls below the output voltage of the power source to warn the hearing aid wearer that the power source is running low.

SUMMARY OF INVENTION

The disadvantage of the known hearing aid is that the warning about the power source running low may be issued so late that under certain circumstances it is no longer possible to exchange the power source in good time.

A method is known from DE 198 25 750 A1 for checking the state of charge of the power source of a hearing aid. The hearing aid equipped with a signal receiver, an amplifier and transmitter part, an output converter and a power source features a means of switching for activating a test circuit which records the voltage at the power source and, if a normal voltage is present, generates an electrical signal which the output converter changes into a data signal which provides information about the state of charge of the power source.

An object of the present invention is thus to improve the information relating to the state of charge of the power source.

This object is achieved by the claims.

The hearing aid or hearing aid system in accordance with the invention comprises means for operating the hearing aid or hearing aid system. These can be embodied for example as controls which can be operated manually, such as push buttons. In addition a remote control can also be available for operating the hearing aid. With the hearing aid according to the invention, in addition to controls which can be operated manually, other means of operation can also be provided, e.g. a speech decoder to recognize spoken code words which initiates specific operating functions.

The hearing aid according to the invention includes means for determining the state of charge of the power source. The state of charge is preferably determined by measuring the current output voltage of the power source. However other physical variables indicating the state of charge can be determined and evaluated, such as short circuit current, capacitance, inductance etc. In particular a number of these variables can be evaluated jointly. Furthermore the state of charge can also be determined by taking account of the length of time that the power source has been in the hearing aid and especially by taking account of the length of time during which the hearing aid was switched on during this period.

The hearing aid wearer is then provided with information about the current state of charge of the power source by an acoustic signal indicating the current state of charge which is emitted by the electro-acoustic output converter of the hearing aid.

Since the information regarding the current state of charge of the power source is linked to operation of the hearing aid, the state of charge can be interrogated at any time by the user. This is advantageous especially if the hearing aid wearer does not have the opportunity to replace the power source over a longer period. This is the case when attending a concert for example. The user can then decide himself whether to change the power source as a precaution, even if the power source currently being used is not yet exhausted.

With a variant of the invention there is provision, instead of information about the state of charge of the power source, for information to be provided relating to the remaining life of the currently used power source using the given hearing aid settings. To this end the hearing aid in accordance with the invention is equipped with means for determining the expected life remaining in the power source. These means preferably also take account of the output voltage, the output current or the time for which the current power source has been in use.

With one embodiment of the invention there is provision for the hearing aid to include means for entering data (e.g., input device 20) to identify the power source currently being used and to determine the current state of charge or the expected remaining life in relation to this data. This data can for example indicate the type of power source used, e.g. Zinc-air battery or Lithium-Ion battery or technical information such as rated voltage or storage capacity.

A preferred embodiment of the invention makes provision for data to identify the type of power source used to be automatically generated in the hearing aid. To this end, the hearing aid is equipped with means for generating such data (e.g., computing device 22). Thus for example the no-load voltage or the short-circuit current of a new power source used in the hearing aid can provide this information. In addition it is also possible for the power source itself to be provided with means of identification which can be recorded by the hearing aid. These means of identification can be both of a mechanical and an electrical nature.

The operation of the hearing for retrieving the information relating to the state of charge of the power source or its remaining life is preferably undertaken by a control arranged on the hearing aid. To keep the space required on the hearing aid for operating the hearing aid as small as possible, this control can also perform further functions, such as switching from program to program. In addition it is also possible for the operating element to be arranged on a remote control. In particular this allows the state of charge or the remaining life of the power source to be interrogated in a way which is undetectable to third parties. The operating element of the remote control can thus be actuated concealed from view, in a wearer's pants pocket for example, and also the output of the acoustic signal to provide information relating to the state of charge of the power source or the remaining power source life cannot be detected by an external party.

Another option is for the information relating to the state of charge or the remaining life to be triggered be an acoustic signal issued to the hearing aid, e.g. a spoken code word. This method also considerably simplifies the operation of the hearing aid.

A further advantageous development of the invention is to link the information relating to the state of charge or the remaining life of the power source to the operation of an on/off switch. The hearing aid wearer is then reminded about the state of charge or the remaining life of the power source each time the hearing aid is switched on or switched off.

With one embodiment of the invention there is provision for the acoustic signal emitted by the output converter to be a tone, and especially a sine-wave tone with a rising or falling frequency. This is done by setting a threshold or by programming the hearing aid so that if the value of the state of charge or the remaining life exceeds this threshold the tone with the rising frequency will be output and if the value drops below this threshold the tone with the falling frequency will be output. The duration and the change in frequency of the tone output can serve as a measure for how far the state of charge or the remaining life deviates from the threshold value. This provides a simple way of enabling a comparatively precise estimation of the state of charge or of the remaining life to be obtained.

A more convenient embodiment of the invention provides for the information relating to the state of charge or the remaining power source life to be output as speech. This can provide very precise information about the state of charge, for example a percentage figure, or very precise information about the remaining life, for example a figure in hours and minutes.

Hearing aid wearers are frequently supplied binaurally, i.e. with a hearing aid for each of their ears. The information relating to the state of charge or the remaining life is preferably provided such that a single operation, for example a code word spoken once or a single actuation of the remote control, suffices, and the two hearing aids are controlled so that the relevant information relating to the state of charge or the remaining life is output in turn. The hearing aid wearer is then informed in a simple manner about the overall status of the hearing aid.

BRIEF DESCRIPTION OF THE DRAWINGS

The invention is explained in more detail below on the basis of exemplary embodiments. The Figures show.

DETAILED DESCRIPTION OF INVENTION

Figure 1:
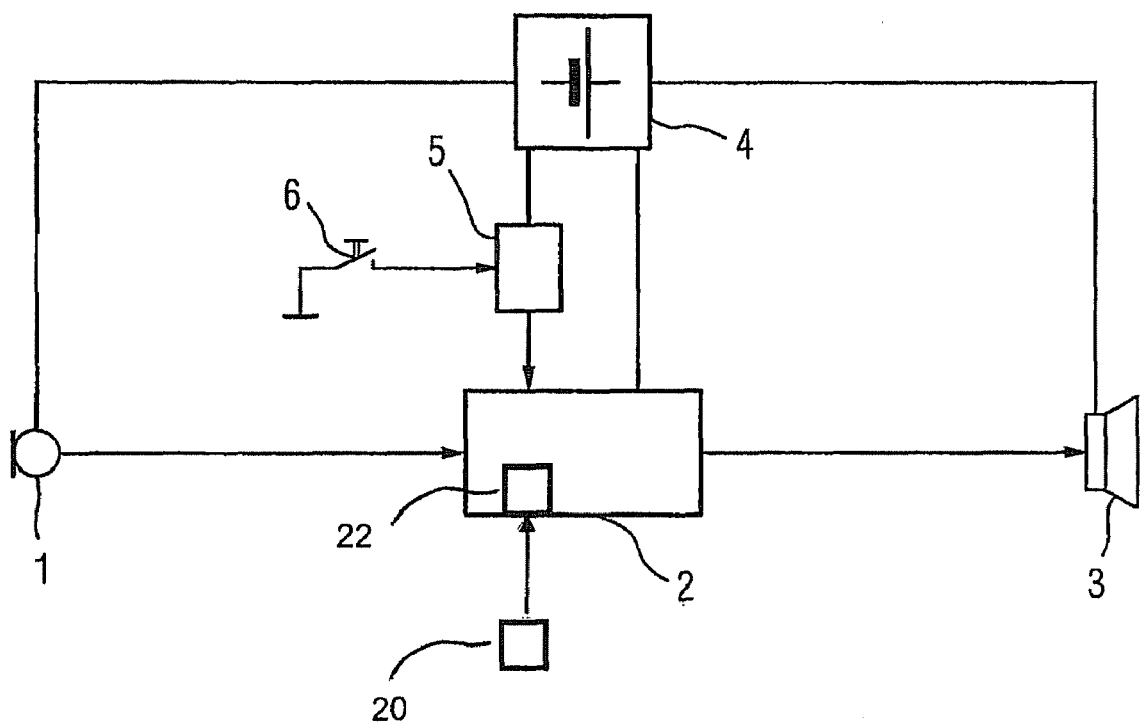
FIG. 1 a block diagram of a hearing aid in accordance with the invention.

FIG. 1 shows a hearing aid with a microphone 1 (input converter) for accepting an acoustic input signal and converting it into an electrical signal. The electrical signal is fed for further processing and frequency-dependent amplification to a signal processing unit 2. The processed signal is finally converted by the earpiece 3 (an output converter) into an acoustic signal and fed to the hearing of a hearing aid wearer. A power source in the form of a battery 4 is provided for supplying power to the microphone 1, the signal processing unit 2 and the earpiece 3. In addition the battery 4 is connected to an evaluation unit 5 via which the state of charge of the battery 4 or the expected remaining battery life of the hearing aid with the battery 4 can be determined. The evaluation unit 5 becomes active especially when the push-button 6 is manually actuated to trigger a request for the state of charge or the remaining battery life. Determining the state of charge or the remaining battery life depends for example on measuring the no-load voltage of the power source, on measuring the output voltage of the power source under a specific load or on briefly measuring the short-circuit current. However other electrical variables such as for example the capacitance or inductance of the power source can be measured. The state of charge or the remaining battery life is preferably determined by taking into account a number of measured variables. In addition non-electrical variables, for example the length of time for which the power source has been in the hearing aid or the time for which the hearing aid has been in operation with the relevant power source can define or influence the determination of the state of charge or of the remaining life.

The evaluation unit 5 comprises a signal generator to generate a characteristic signal for the state of charge or for the remaining life. This signal is injected into the signal path of the hearing device, converted via the earpiece 3 into an acoustic signal and directed to the hearing of the hearing aid wearer.

The invention offers the advantage of enabling the hearing aid wearer to be informed at any time about the current state of charge of the power source or the expected remaining life of the hearing aid with the power source concerned. This means that a battery which is about to become exhausted is detected and can be exchanged in good time if necessary. A sine wave signal with rising or falling frequency is selected as the acoustic output signal to provide information about the state of charge or the remaining life of the battery. Advantageously, when the state of charge of the battery is determined, a comparison is made with a threshold value, e.g. 50% of the maximum charge. If the current state of charge is more than 50%, i.e. it exceeds the threshold value, an acoustic signal with rising frequency is output. The frequency increase as well as the duration of the signal indicate by much the value deviates from the threshold value. The same applies to a state of charge below the 50% mark. However, to make a distinction an output signal with a falling frequency is s elected in this case. The threshold value is preferably able to be set by programming the hearing aid.

With another embodiment of the invention a speech signal which informs the user directly about the state of charge or the remaining life is generated by the signal generator.

Figure 2:
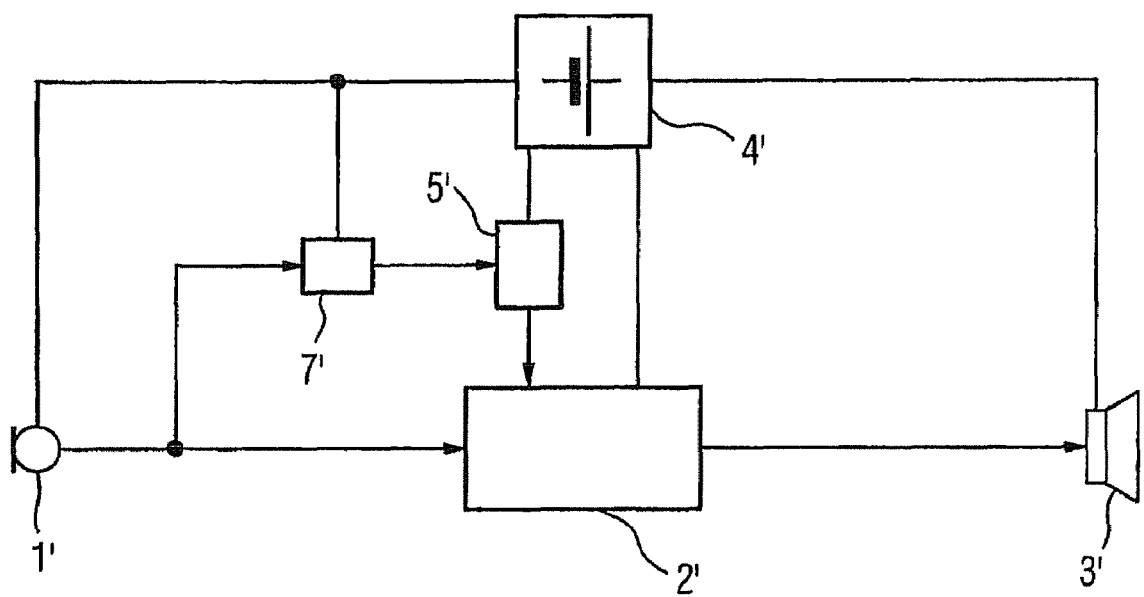
FIG. 2 a block diagram of a further embodiment of a hearing aid in accordance with the invention, FIG. 3 a hearing aid system with two hearing aids and a remote control.

FIG. 2 shows a further exemplary embodiment of the invention. In this case the components 1', 2', 3', 4' and 5' correspond to the components shown without an apostrophe after the number in FIG. 1. However, unlike in the exemplary embodiment depicted in FIG. 1, the hearing aid shown in FIG. 2 is equipped with an analysis unit 7' to which the electrical input signal 1' of the microphone is fed. The analysis unit 7' detects code words contained in the acoustic input signal, said words enabling the hearing aid to be voice controlled. Thus for example the code word "battery check" can trigger information for the user relating to state of charge and remaining life of the battery.

Figure 3:
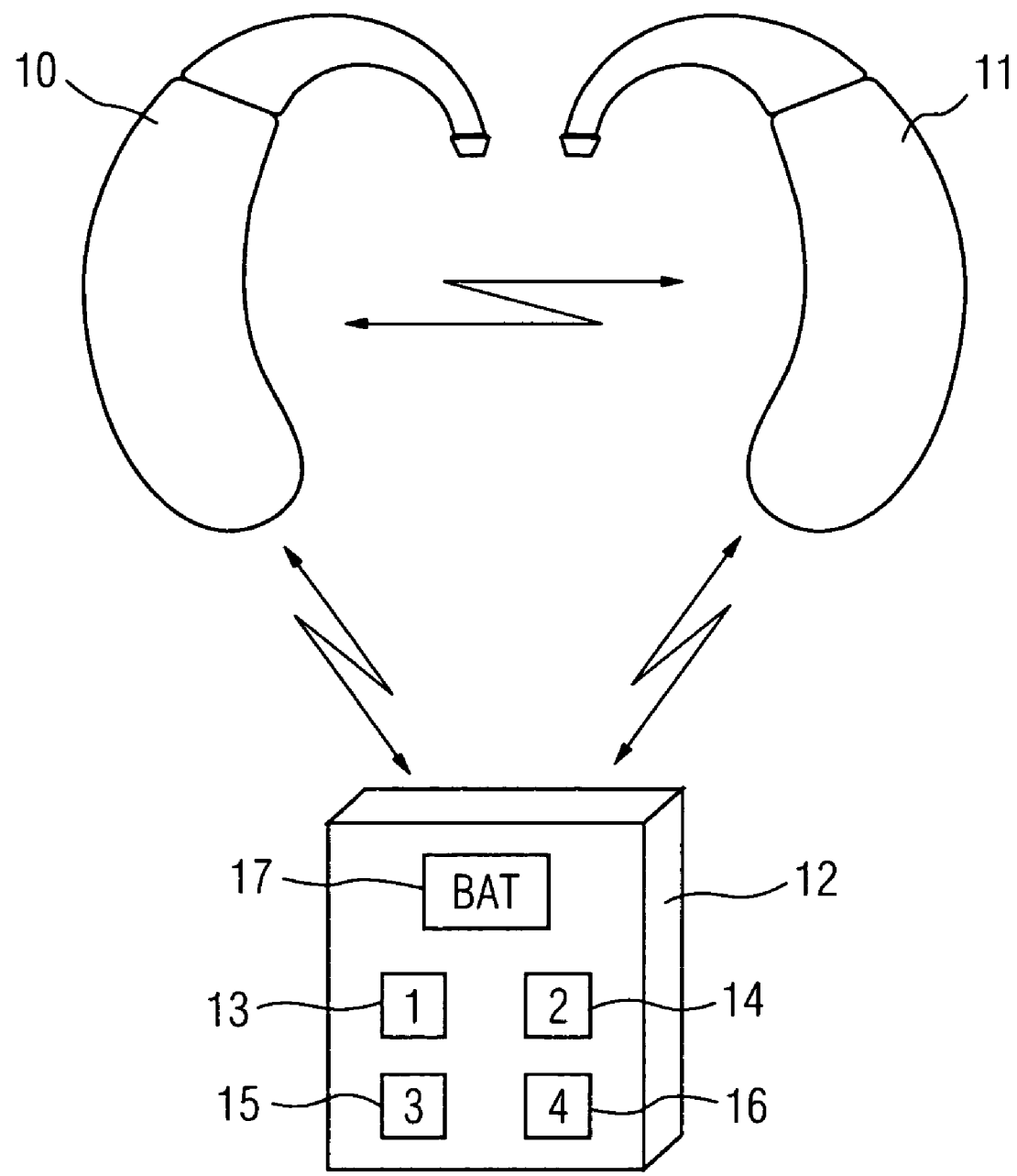

The exemplary embodiment according to FIG. 3 illustrates a hearing aid system with a first hearing aid 10 and a second hearing aid 11 for binaural supply of a hearing aid wearer. Further the hearing aid system includes a remote control 12 for operating the two hearing aids 10 and 11. Wireless data transmission is possible between the remote control 12 and the hearing aids 10 and 11 and also between the two hearing aids 10 and 11. Operating the buttons 13, 14, 15 or 16 on the remote control 12 allows different hearing programs to be set for the hearing aids 10 and 11 to suit different hearing environments. In accordance with the invention, operating the button 17 on the remote control 12 enables the hearing aid wearer to be provided with information relating to the state of charge of the two hearing aid power sources or their remaining life. The two hearing aids 10 and 11 are in this case controlled in such a way that the hearing aid wearer is first informed about the state of charge or remaining life of hearing aid 10. Subsequently hearing aid 10 transmits a signal to hearing aid 11, after the receipt of which this hearing aid too outputs a corresponding acoustic signal for information relating to the state of charge or remaining life of its power source.

Only in exceptional cases are both ears of a hearing aid wearer affected simultaneously by a degradation in hearing capabilities. To this extent the two hearing devices 10 and 11 are as a rule operated with different parameters for binaural supply. However this also causes power to be consumed at correspondingly different rates by the two hearing aids 10 and 11. It is thus sensible, even if the two power sources of the two hearing aids 10 and 11 have been exchanged at the same time, to inform the hearing aid wearer separately about the state of charge or the remaining life of the two hearing aids.

The invention claimed is:

1. A hearing aid, comprising:
   an input converter for acquiring an input signal and converting the input signal into an electrical signal;
   a signal processing unit for processing and amplifying the electrical signal, the amplification of the electrical signal depending on a frequency included in the input signal;
   an output converter for generating and outputting acoustic output signals;
   a power source for supplying power to the hearing aid; and
   an evaluation unit configured to determine a property indicative of an operational condition of the power source, the property chosen from the group consisting of a current capacity and an expected remaining operating time, and the output converter is configured to generate an acoustic output signal based on the determined property, wherein the acoustic output signal consists of a tone having a rising frequency when the property indicative of the operational condition of the power source is above a pre-defined threshold value, and further wherein the acoustic output signal consists of a tone having a falling frequency when the property indicative of the operational condition of the power source is below the pre-defined threshold value.

2. The hearing aid in accordance with claim 1, further comprising an input device for entering data identifying the power source, wherein the property is determined based on the data.

3. The hearing aid in accordance with claim 1, further comprising a computing device for analyzing the power source and generating data identifying the power source.

4. The hearing aid in accordance with claim 1, further comprising a control element.

5. The hearing aid in accordance with claim 4, wherein the control element is included a remote control for operating the hearing aid.

6. The hearing aid in accordance with claim 1, wherein the hearing aid is configured to be operated by an acoustic command.

7. The hearing aid in accordance with claim 6, wherein the acoustic command includes a voice command.

8. The hearing aid in accordance with claim 1, wherein operating the hearing aid includes switching the hearing aid on or off.

9. The hearing aid in accordance with claim 1, wherein a duration of the tone or a change in frequency of the tone represents a degree of the threshold violation.

10. The hearing aid in accordance with claim 1, wherein the acoustic output signal includes a voice signal.

11. A hearing aid system for binaural supply of a hearing aid wearer, comprising:
    a first and a second hearing aid;
    a first output converter for generating and outputting a first acoustic output signals, the first output converter assigned to the first hearing aid;
    a second output converter for generating and outputting a second acoustic output signals, the second output converter assigned to the second hearing aid;
    a first power supply assigned to the first hearing aid;
    a second power supply assigned to the second hearing aid; and
    an evaluation unit configured to independently determine a first property indicative of an operational condition of the first power source and a second property indicative of an operational condition of the second power source, the first and second properties chosen from the group consisting of a current capacity and an expected remaining operating time,
    the first and second output converters are configured to generate a first and a second acoustic output signal based on the first and second properties, and
    the first and second acoustic output signals are output consecutively upon an operating command, wherein the first acoustic output signal consists of a first tone having a rising frequency when the property indicative of the operational condition of the first power source is above a pre-defined threshold value, and further wherein the first acoustic output signal consists of the first tone having a falling frequency when the property indicative of the operational condition of the first power source is below the pre-defined threshold value, wherein the second acoustic output signal consists of a second tone having a rising frequency when the property indicative of the operational condition of the second power source is above the pre-defined threshold value, and further wherein the second acoustic output signal consists of the second tone having a falling frequency when the property indicative of the operational condition of the second power source is below the pre-defined threshold value, wherein the first tone and the second tone comprise distinct tones.

* * * * *